United States Patent
Yoon et al.

(10) Patent No.: US 10,711,990 B2
(45) Date of Patent: Jul. 14, 2020

(54) LIGHT SOURCE MODULE

(71) Applicant: SAMSUNG ELECTRONICS CO., LTD., Suwon-si (KR)

(72) Inventors: Young Jeong Yoon, Suwon-si (KR); Yoon Joon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 50 days.

(21) Appl. No.: 16/232,247

(22) Filed: Dec. 26, 2018

(65) Prior Publication Data

US 2019/0368717 A1 Dec. 5, 2019

(30) Foreign Application Priority Data

Jun. 5, 2018 (KR) .................. 10-2018-0064768

(51) Int. Cl.
| | |
|---|---|
| *F21V 29/70* | (2015.01) |
| *F21V 23/06* | (2006.01) |
| *H01L 33/62* | (2010.01) |
| *F21V 19/00* | (2006.01) |
| *H01L 33/64* | (2010.01) |

(52) U.S. Cl.
CPC ............ *F21V 29/70* (2015.01); *F21V 19/004* (2013.01); *F21V 23/06* (2013.01); *H01L 33/62* (2013.01); *H01L 33/644* (2013.01)

(58) Field of Classification Search
None
See application file for complete search history.

(56) References Cited

U.S. PATENT DOCUMENTS

| | | |
|---|---|---|
| 6,242,280 B1 | 6/2001 | Koay et al. |
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |

(Continued)

FOREIGN PATENT DOCUMENTS

| | | |
|---|---|---|
| KR | 20-0447906 Y1 | 3/2010 |
| KR | 10-0972981 B1 | 7/2010 |

(Continued)

*Primary Examiner* — Steven B Gauthier
(74) *Attorney, Agent, or Firm* — Sughrue Mion, PLLC

(57) ABSTRACT

A light source module includes a heat sink having a mounting region; a light emitting device package having a first surface disposed on the mounting region of the heat sink and a second surface that is opposite to the first surface, the light emitting device package including a connection pad disposed on the second surface; a circuit board disposed on the mounting region of the heat sink and spaced apart from the light emitting device package, the circuit board including a connector and a terminal electrically connected to the connector; and a bracket disposed between the light emitting device package and the circuit board on the mounting region of the heat sink, and coupled to the heat sink, the bracket including a lead frame pressing the connection pad and the terminal to connect the connection pad and the terminal.

20 Claims, 7 Drawing Sheets

(56) References Cited

U.S. PATENT DOCUMENTS

| | | |
|---|---|---|
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,241,044 B2 | 8/2012 | Mostoller et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2002/0047646 A1* | 4/2002 | Lys .............. H05B 45/00 315/312 |
| 2006/0044840 A1 | 3/2006 | Watanabe et al. |

FOREIGN PATENT DOCUMENTS

| | | |
|---|---|---|
| KR | 10-0997172 B1 | 11/2010 |
| KR | 10-1386624 B1 | 4/2014 |
| KR | 10-2014-0066961 A | 6/2014 |

\* cited by examiner

LIGHT SOURCE MODULE

CROSS-REFERENCE TO RELATED APPLICATION(S)

This application claims priority from Korean Patent Application No. 10-2018-0064768 filed on Jun. 5, 2018, in the Korean Intellectual Property Office, the disclosure of which is incorporated herein by reference in its entirety.

BACKGROUND

1. Field

The present disclosure relates to a light source module.

2. Description of Related Art

Semiconductor light emitting devices emit light, using the principle of recombination of electrons and holes, when an electric current is applied to the semiconductor light emitting devices. The semiconductor light emitting devices are widely used as light sources due to various positive attributes, such as low power consumption, high brightness, miniaturization and the like. After the development of nitride-based light emitting devices, the range of application of semiconductor light emitting devices has been further expanded. For example, the semiconductor light emitting devices have been employed in automobile lighting, requiring high-current/high-power light source modules.

In the case of light source modules used for existing automobile lighting, semiconductor light emitting device packages and heat sinks having various shapes and sizes have been fabricated for respective automobile models. For example, according to automobile model, different equipment for mounting a semiconductor light emitting device package and a heat sink, corresponding to the different automobile models, is required. As a result, manufacturing costs may be increased and quality control of products may be difficult.

SUMMARY

One or more example embodiments provide a light source module facilitating manufacturing thereof and having reduced manufacturing costs.

According to an aspect of an example embodiment, a light source module includes a heat sink having a mounting region; a light emitting device package having a first surface disposed on the mounting region of the heat sink and a second surface that is opposite to the first surface, the light emitting device package including a connection pad disposed on the second surface; a circuit board disposed on the mounting region of the heat sink and spaced apart from the light emitting device package, the circuit board including a connector and a terminal electrically connected to the connector; and a bracket disposed between the light emitting device package and the circuit board on the mounting region of the heat sink, and coupled to the heat sink, the bracket including a lead frame pressing the connection pad and the terminal to connect the connection pad and the terminal.

According to an aspect of another example embodiment, a light source module includes a heat sink having a mounting region; a light emitting device package having a first surface disposed on the mounting region of the heat sink and a second surface opposite to the first surface, the light emitting device package including a first connection pad and a second connection pad that are disposed on the second surface; a circuit board disposed on the mounting region of the heat sink and spaced apart from the light emitting device package, the circuit board including a connector, a first terminal electrically connected to the connector, and a second terminal electrically connected to the connector; and a bracket disposed between the light emitting device package and the circuit board on the mounting region of the heat sink, and coupled to the heat sink, the bracket including a first lead frame pressing the first connection pad and the first terminal to connect the first connection pad and the first terminal, and a second lead frame pressing the second connection pad and the second terminal to connect the second connection pad and the second terminal.

According to an aspect of another example embodiment, a light source module includes a heat sink; a light emitting device package coupled to the heat sink, the light emitting package including a first connection pad and a second connection pad that are provided on a first surface of the light emitting device package and through which power is applied to the light emitting device package; a circuit board disposed on the heat sink and spaced apart from the light emitting device package, the circuit board including a connector, a first terminal and a second terminal, wherein the first terminal and the second terminal are provided on an upper surface of the connected and electrically connected to the connector; and a bracket coupled to the heat sink, the bracket including: a body disposed between the light emitting device package and the circuit board; a first lead frame; and a second lead frame, each of the first lead frame and the second lead frame having both ends exposed outside of the body, wherein the first lead frame presses the first connection pad and the first terminal to connect the first connection pad and the first terminal, and the second lead frame presses the second connection pad and the second terminal to connect the second connection pad and the second terminal.

BRIEF DESCRIPTION OF DRAWINGS

The above and/or other aspects, features, and advantages will be more clearly understood from the following detailed description of example embodiments, taken in conjunction with the accompanying drawings, in which.

DETAILED DESCRIPTION

Hereinafter, various example embodiments will be described in detail with reference to the accompanying drawings.

Figure 1:
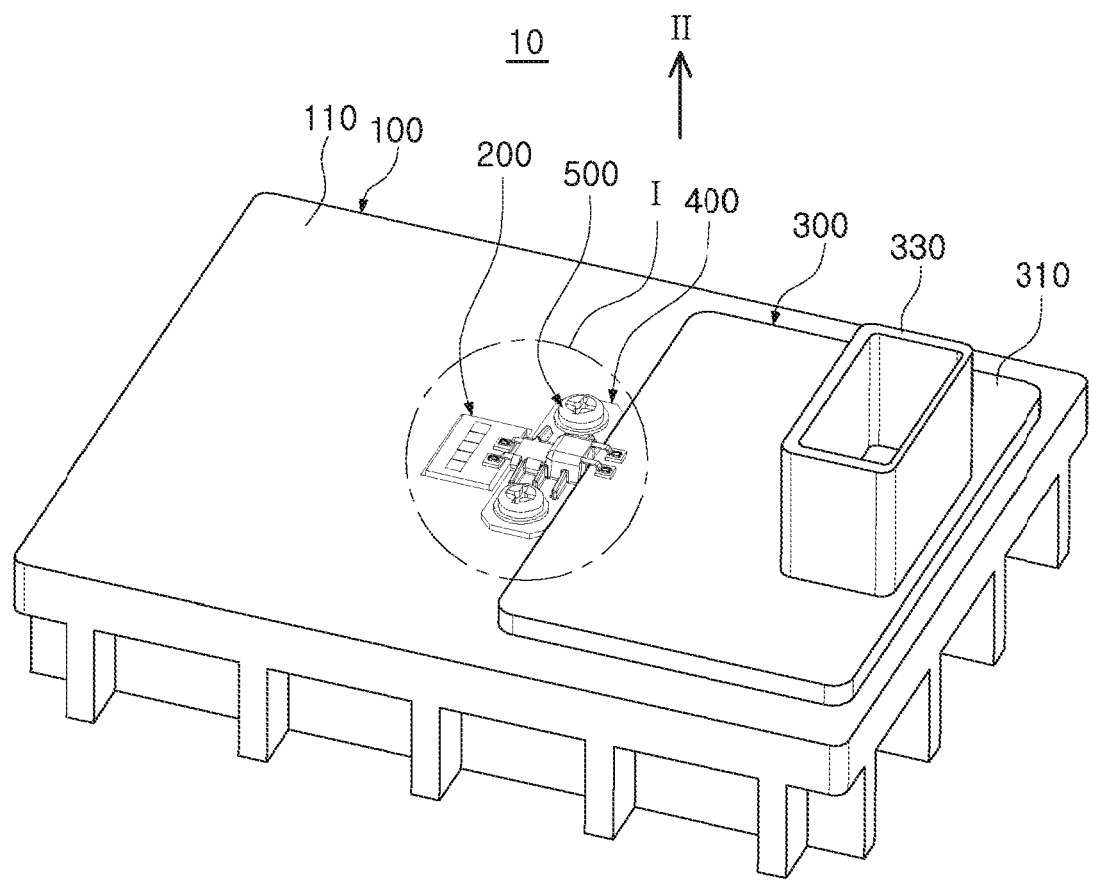
FIG. 1 is a perspective view of a light source module according to an example embodiment.
Figure 2:
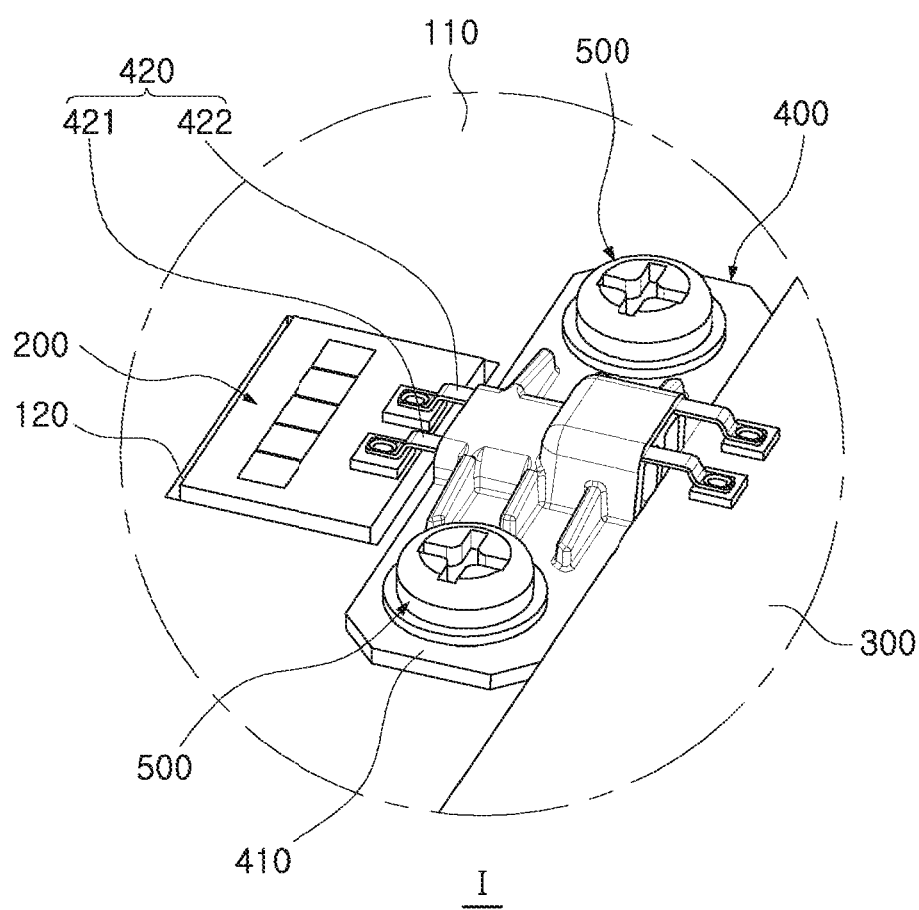
FIG. 2 is an enlarged view of portion I of FIG. 1.
Figure 3:
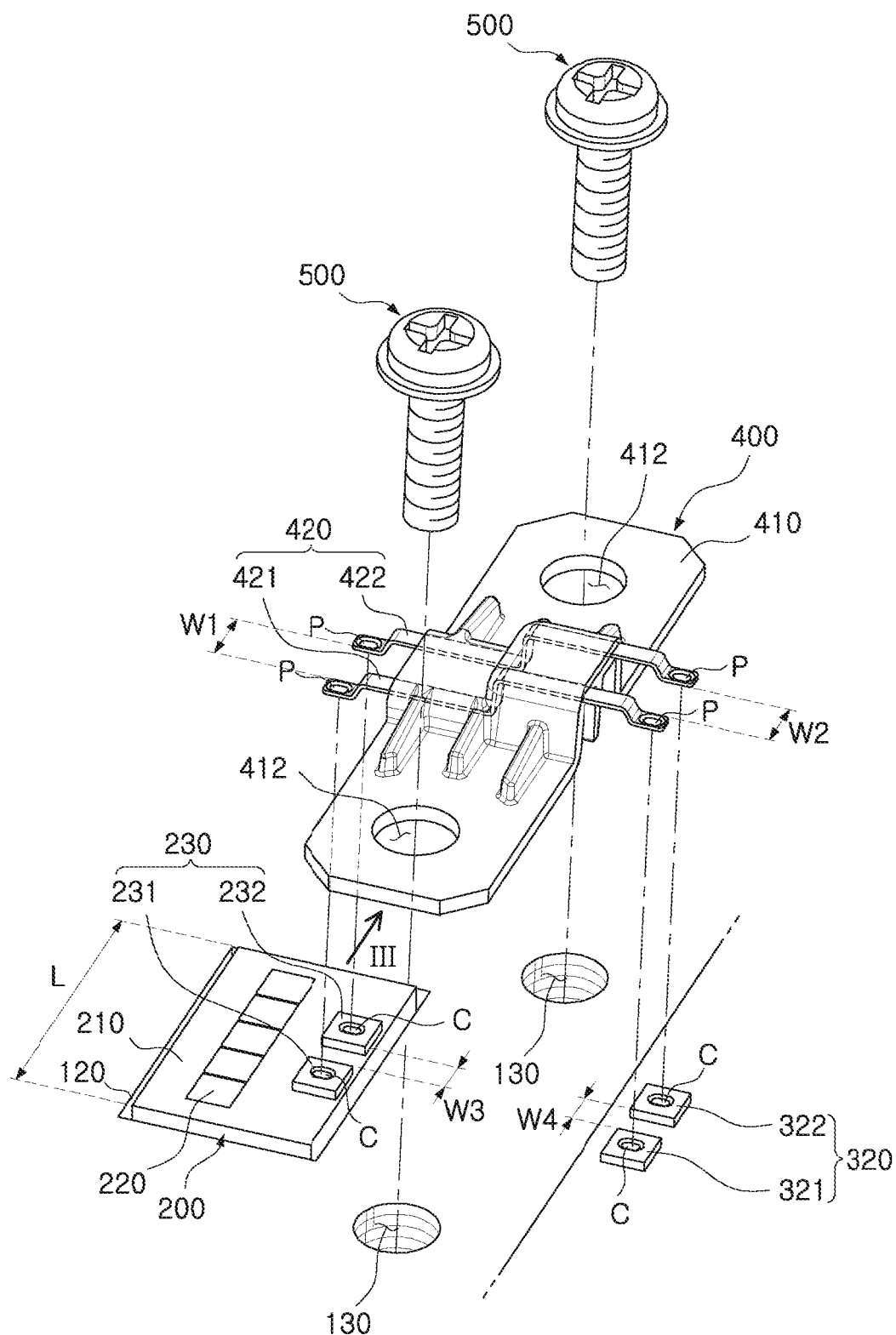
FIG. 3 is a partially exploded perspective view of FIG. 2.

FIG. 1 is a perspective view of a light source module according to an example embodiment, FIG. 2 is an enlarged view of portion I of FIG. 1, and FIG. 3 is a partially exploded perspective view of FIG. 2.

As illustrated in FIG. 1, a light source module 10 according to an example embodiment may include a heat sink 100 having a mounting region 110, a light emitting device package 200 and a circuit board 300, respectively mounted on the mounting region 110, and a bracket 400 electrically connecting the light emitting device package 200 and the circuit board 300 to each other.

The heat sink 100 may be a heat dissipating device to rapidly discharge heat emitted by the light emitting device package 200, and may be formed of a metal material having excellent thermal conductivity, such as aluminum. The mounting region 110 may be on an upper surface of the heat sink 100 (hereinafter, a surface facing in (perpendicular to) 'direction II' in FIG. 1 is defined as an upper surface), on which the light emitting device package 200, the circuit board 300 and the bracket 400 are mounted. Although the mounting region 110 is illustrated as being a quadrangular plane in the example embodiment, the shape of the mounting region 110 is not limited thereto, and may be modified depending on the shape of the light emitting device package 200 and the circuit board 300.

Referring to FIGS. 2 and 3, a recessed area 120 may be formed in the mounting region 110 to mount the light emitting device package 200 therein. That is, the light emitting device package 200 may be mounted in the recessed area 120. The mounting region 110 may be provided with at least one coupling groove (or hole) 130 formed therein, to be coupled to the bracket 400, and at least one coupling member 500 may be coupled to the coupling groove 130, to fix the bracket 400 to the mounting region 110.

Referring to FIG. 3, the light emitting device package 200 may include a package body 210, one or more light emitting devices 220 mounted on the package body 210, and a connection pad 230 electrically connected to the light emitting device 220, through which power is supplied to the light emitting device(s) 220. The light emitting device 220 may be provided as a plurality of light emitting devices, and an example embodiment illustrates a case in which five light emitting devices 220 are arranged in a row as an example. However, example embodiments are not limited thereto and the number of light emitting devices may be changed based on the design intent.

In the case of the package body 210, a synthetic resin substrate using a resin, a glass epoxy or the like, or a ceramic substrate in consideration of thermal conductivity, may be used. In addition, a metal substrate or the like, using insulation-processed aluminum, copper, zinc or the like, may also be used.

The connection pad 230 may be disposed on an upper surface of the light emitting device package 200. In an example embodiment, the connection pad 230 may include first and second connection pads 231 and 232. Concave portions C may be respectively provided in an upper surface of the first and second connection pads 231 and 232, to engage with convex portions P provided on a lead frame 420 of the bracket 400, to be described below, in such a manner that the lead frame 420 may be firmly fixed to the first and second connection pads 231 and 232.

The first and second connection pads 231 and 232 may have a constant interval W3 therebetween, regardless of the number of the light emitting devices 220. For example, even in a case in which a length L of the light emitting device package 200 is increased due to an increase in the number of the mounted light emitting devices 220, the first and second connection pads 231 and 232 may be disposed, such that the interval W3 between the first and second connection pads 231 and 232, and positions thereof are kept constant. Thus, a shape of the bracket 400 connected to the first and second connection pads 231 and 232 may not be changed even in the case in which the number of the light emitting devices 220 mounted on the light emitting device package 200 is changed.

Referring to FIGS. 1 and 3, the circuit board 300 may include a connector 330 for a connection of the light source module 10 to an external device, and a terminal 320 for a connection to the bracket 400, on an upper surface of a substrate 310. The substrate 310 may include a circuit wiring electrically connecting the connector 330 and the terminal 320 to each other, in the interior thereof, and an insulating protection layer may be disposed on the upper surface of the substrate 310, to protect the circuit wiring. In an example embodiment, the terminal 320 may include first and second terminals 321 and 322. Concave portions C may be respectively provided in upper surfaces of the first and second terminals 321 and 322 to be engaged with convex portions P formed on the lead frame 420 of the bracket 400 to be described below, such that the lead frame 420 may be firmly fixed to the first and second terminals 321 and 322. The first and second terminals 321 and 322 may spaced apart by an interval W4 equal to the interval W3 between the first and second connection pads 231 and 232.

According to an example embodiment, the connector 330 may be provided in the form of a terminal, connected to electrical wires through soldering.

The bracket 400 may be disposed between the light emitting device package 200 and the circuit board 300, to electrically connect the light emitting device package 200 and the circuit board 300 to each other. Thus, power or a control signal supplied by an external device connected through the connector 330 of the circuit board 300 may be provided to the light emitting device package 200.

The bracket 400 may include a body 410 coupled to the mounting region 110 of the heat sink 100, and the lead frame 420 passing through the body 410.

The body 410 may be formed by inserting an insulating synthetic resin into the lead frame 420, through insert molding. The body 410 may be coupled to the mounting region 110 of the heat sink 100 by at least one coupling member 500. As a material of the coupling member 500, any material may be used without particular limitation so long as it may firmly couple the body 410 to the mounting region 110, such as a screw, a rivet, an adhesive (or an adhesive tape) or the like. The example embodiment shown in FIG. 3 illustrates a case in which the coupling member 500 is a screw by way of example. The body 410 may include at least one through-hole 412 formed therein, through which the coupling member 500 such as a screw penetrates and is fastened to the coupling groove 130 of the mounting region 110. Although the example embodiment provides two through-holes 412 in an example, an example embodiment thereof is not limited thereto, and the shape and number of the through-holes 412 may be modified.

The lead frame 420 may be provided in a number corresponding to the number of the connection pad 230 of the light emitting device package 200 and the number of the terminal 320 of the circuit board 300. An example embodiment shown in FIG. 3 illustrates a case in which the lead frame 420 includes the first and second lead frames 421 and 422 by way of example. The first lead frame 421 may be disposed to connect the first connection pad 231 to the first terminal 321, and the second lead frame 422 may be disposed to connect the second connection pad 232 and the second terminal 322. Intervals W1 and W2 between respective ends of the first and second lead frames 421 and 422 may correspond to the interval W3 between the first and second connection pads 231 and 232, and the interval W4 between the first and second terminals 321 and 322, respectively.

Figure 4:
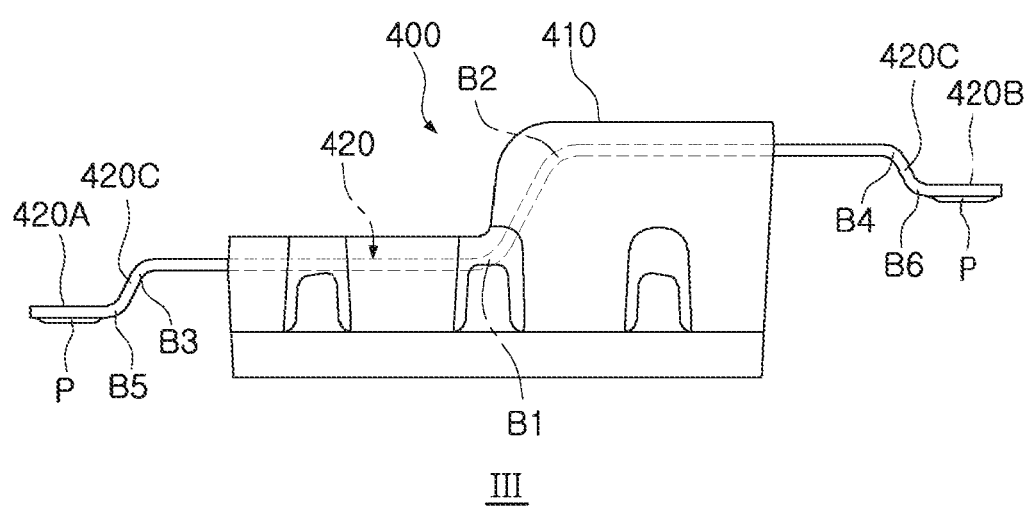
FIG. 4 is a cross-sectional view of a bracket, taken in direction III of FIG. 3.
Figure 5:
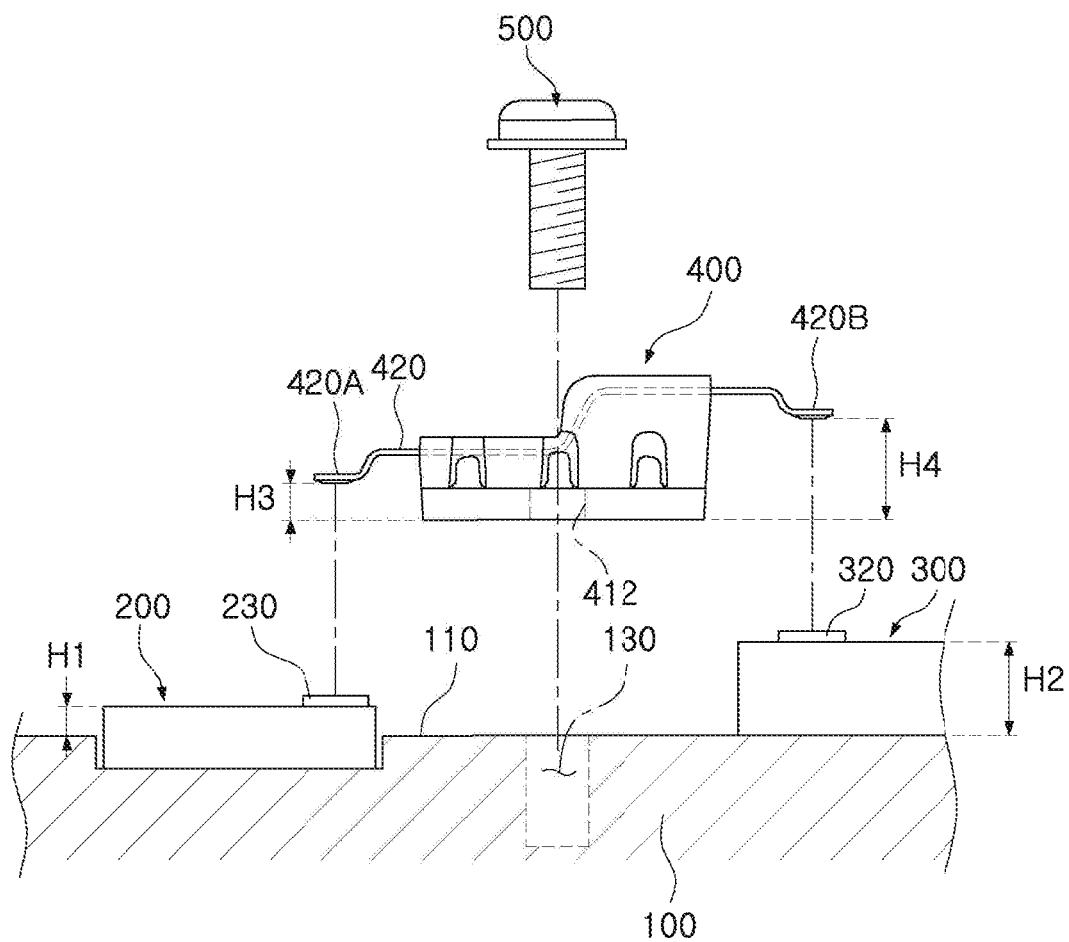
FIGS. 5 and 6 are views illustrating a process of fixing a bracket according to an example embodiment.

Referring to FIGS. 4 and 5, the lead frame 420 may be disposed, in such a manner that a first end 420A of the lead frame 420 and a second end 420B of the lead frame 420, opposite to the first end 420A, are exposed outside of the body 410, and may include first and second bent portions B1 and B2 to adjust positions in which the first and second ends 420A and 420B are disposed. The first and second ends 420A and 420B of the lead frame 420 may have elastic portions 420C provided by third and fourth bent portions B3 and B4 formed by bending the lead frame 420 downwardly, the third and fourth bend portions B3 and B4 being disposed on portions of the lead frame 420, spaced apart from the first and second ends 420A and 420B by a predetermined interval. Thus, the first and second ends 420A and 420B of the lead frame 420 may have elastic force to press a surface of the connection pad 230 and a surface of the terminal 320. In addition, fifth and sixth bent portions B5 and B6 may be formed in positions adjacent to the first and second ends 420A and 420B, respectively, such that the convex portions P for the connection to the connection pad 230 and the terminal 320 are provided on the first and second ends 420A and 420B of the lead frame 420. With this structure, the connection pad 230 and the terminal 320 may be electrically and firmly connected to the first and second ends 420A and 420B of the lead frame 420 at the elastic portions 420C. The convex portions P may be formed on the first and second ends 420A and 420B, in a shape corresponding to that of the concave portions C formed in the first and second connection pads 231 and 232 and the first and second terminals 321 and 322. As the convex portions P and the concave portions C are disposed to be interlocked with each other, the lead frame 420 may be firmly fixed to the surfaces of the connection pad 230 and the terminal 320.

Figure 6:
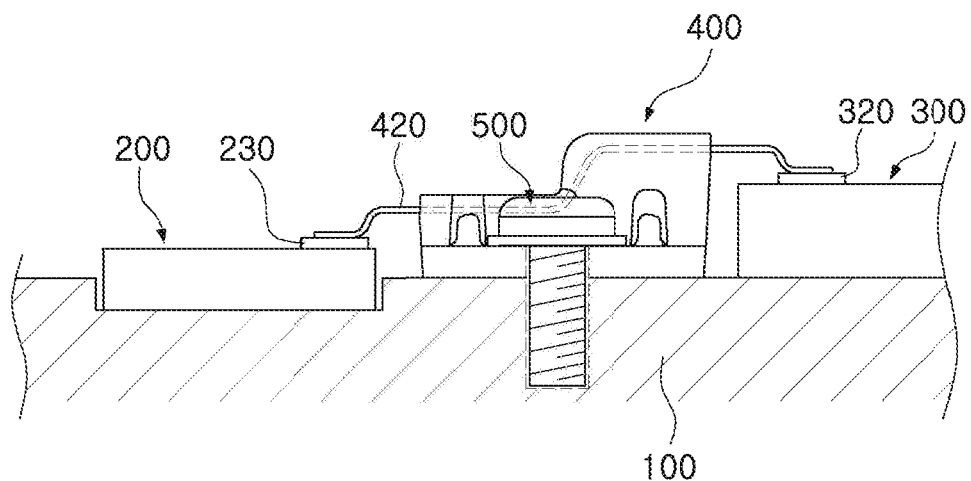

A process in which the bracket 400 connects the connection pad 230 of the light emitting device package 200 and the terminal 320 of the circuit board 300 to each other will be described with reference to FIGS. 5 to 7B. FIGS. 5 and 6 are views illustrating a process of fixing a bracket 400 to the mounting region 110 of the heat sink 100 according to an example embodiment, and FIGS. 7A and 7B are views illustrating a process in which a lead frame 420 is brought into close contact with a connection pad 230 of a light emitting device package 200 by elastic force.

Referring to FIGS. 5 and 6, first and second ends 420A and 420B of the lead frame 420 may be disposed at heights H3 and H4, respectively, with respect to a bottom surface of the bracket 400, corresponding to a height H1 to which the light emitting device package 200 protrudes from an upper surface of the mounting region 110, and to a height H2 of the circuit board 300, respectively. The bracket 400 may be coupled to the heat sink 100 by fastening the at least one coupling member 500 to the at least one coupling groove 130 through the through-hole 412. As the bracket 400 is coupled to the heat sink 100, the first and second ends 420A and 420B of the lead frame 420 may be connected to the connection pad 230 and the terminal 320, while pressing the connection pad 230 and the terminal 320.

Figure 7A:
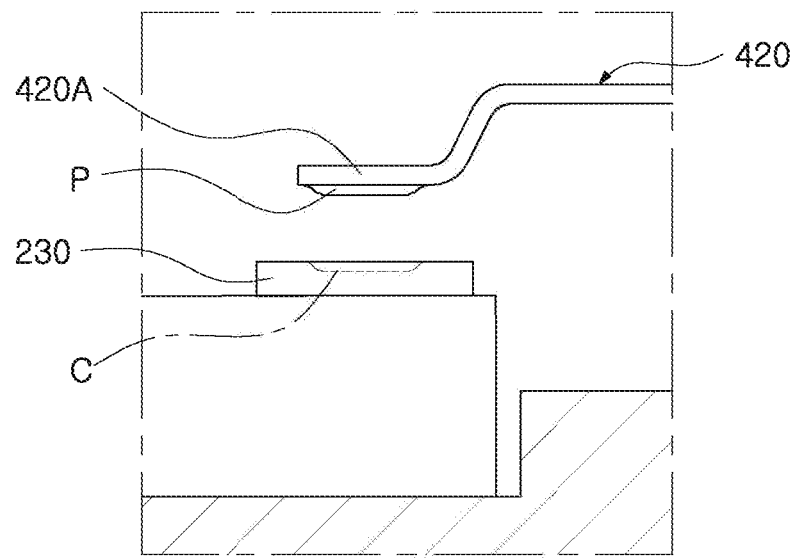
FIGS. 7A and 7B are views illustrating a process in which a lead frame is brought into close contact with a connection pad of a light emitting device by elastic force.
Figure 7B:
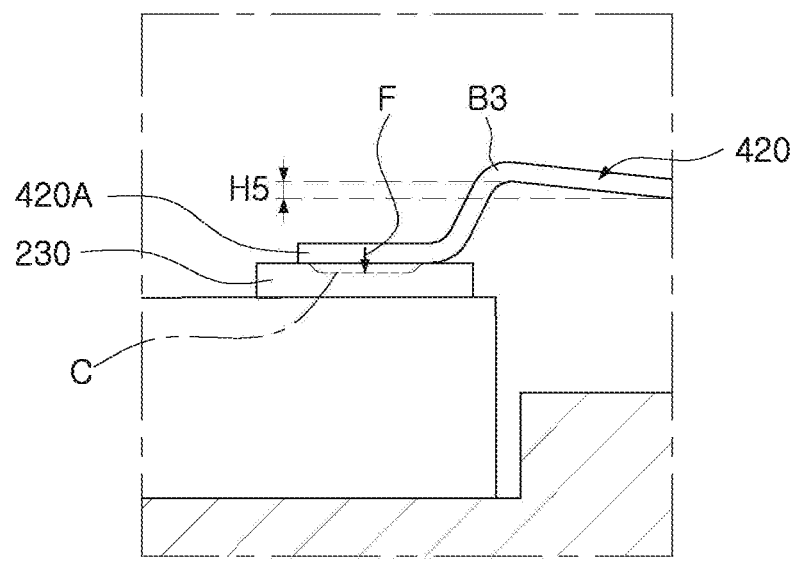

Referring to FIG. 7A, a convex portion P formed on a first end 420A of the lead frame 420 may be provided in a form corresponding to a concave portion C formed in the connection pad 230, to overlap each other. That is, convex portion P of the lead frame 420 is inserted into the concave portion C of the connection pad 230. Referring to FIG. 7B, when the bracket 400 is coupled to the heat sink 100, the third bent portion B3 of the lead frame 420 may be deformed, and the lead frame 420 may be bent by a predetermined distance H5, thereby applying an elastic force F to the first end 420A in a direction to be coupled to the connection pad 230. Thus, the end first 420A may be brought into close contact with the connection pad 230. The second end 420B of the lead frame 420 may be attached to the terminal 320 through the same process, and a description thereof will be omitted.

Figure 8:
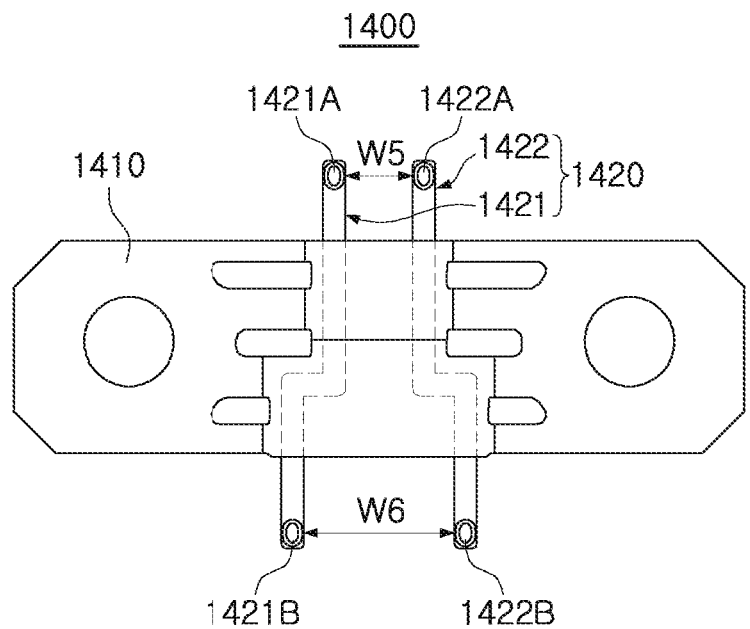
FIGS. 8 and 9 illustrate modified examples of the bracket.
Figure 9:
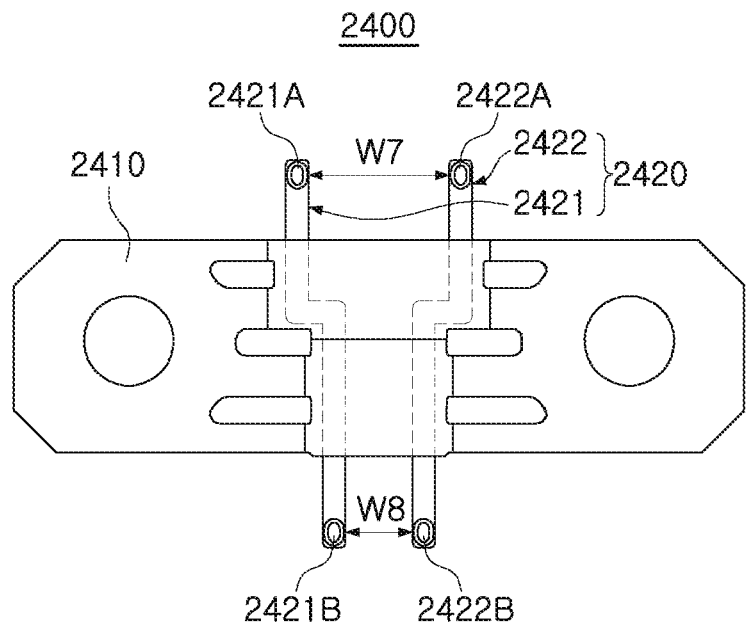

FIGS. 8 and 9 illustrate modified examples of a bracket, for example, a case in which a lead frame is modified, to correspond to a case in which intervals between connection pads of a light emitting device package and intervals between terminals of a circuit board are different from each other.

FIG. 8 illustrates an example in which a bracket 1400 includes first and second lead frames 1421 and 1422 which are modified in such a manner that an interval W6 between second ends 1421B and 1422B connected to terminals of a circuit board is wider than an interval W5 between first ends 1421A and 1422A connected to a connection pad of a light emitting device package.

FIG. 9 illustrates another example in which a bracket 2400 includes first and second lead frames 2421 and 2422 which are modified in such a manner that an interval W7 between first ends 2421A and 2422A connected to a connection pad of a light emitting device package is wider than an interval W8 between second ends 2421B and 2422B connected to terminals of a circuit board. Bodies 1410 and 2410 of FIGS. 8 and 9 may be formed by molding modified lead frames 1420 and 2420, respectively.

As such, a light source module 10 may replace a connection process such as wedge bonding, having been used for connecting a light emitting device package and a circuit board, with a process using the bracket 400. In detail, in the case of the light source module used for automobile lighting, because the light emitting device package and the circuit board having various shapes and sizes are employed depending on respective automobile models, bonding equipment may be required to be set suitably for each case. As the automobile models are diversified, the number of times of changing the setting of bonding equipment is increasing, and thus, the time required accordingly is also increased, and the manufacturing time may be increased, in the case of the related art. In this case, because expensive bonding equipment is required for precise bonding, the cost of the bonding equipment is also increased.

Thus, in an example embodiment, a distance between connection pads of a light emitting device package may be standardized, and the connection pads of the light emitting device package may be coupled to each other by a bracket, thereby replacing an existing bonding process that has been used previously with a process using a bracket. As a result, the time required for setting bonding equipment may be reduced. In addition, because expensive bonding equipment may be replaced by relatively inexpensive assembly equipment, the manufacturing cost of the light source module may be further reduced.

As set forth above, according to example embodiments, a light source module may have the effect of facilitating manufacturing thereof and reducing manufacturing costs.

While example embodiments have been shown and described above, it will be apparent to those skilled in the art that modifications and variations could be made without departing from the scope of the present disclosure as defined by the appended claims.

What is claimed is:

1. A light source module comprising:
a heat sink having a mounting region;
a light emitting device package having a first surface disposed on the mounting region of the heat sink and a second surface that is opposite to the first surface, the light emitting device package comprising a connection pad disposed on the second surface;
a circuit board disposed on the mounting region of the heat sink and spaced apart from the light emitting device package, the circuit board comprising a connector and a terminal electrically connected to the connector; and
a bracket disposed between the light emitting device package and the circuit board on the mounting region of the heat sink, and coupled to the heat sink, the bracket comprising a lead frame pressing the connection pad and the terminal to connect the connection pad and the terminal.

2. The light source module of claim 1, further comprising a coupling member,
wherein the bracket further comprises a body molded to the lead frame, and the coupling member couples the body to the heat sink,
wherein the lead frame comprises a first end and a second end, opposite to the first end, that protrude out of the body.

3. The light source module of claim 2, wherein the lead frame is insert-molded into the body.

4. The light source module of claim 2, wherein the lead frame further comprises an elastic portion bent in a direction toward the first surface of the light emitting device package, to provide elastic force so that the first end and the second end of the lead frame press the connection pad and the terminal, respectively.

5. The light source module of claim 4, wherein the first end and the second end of the lead frame press the connection pad and the terminal, respectively, by the elastic force of the elastic portion, as the body is coupled to the heat sink by the coupling member.

6. The light source module of claim 1, wherein the lead frame comprises a first end and a second end, opposite to the first end, and the first end and the second end are provided at a different heights with respect to the mounting region.

7. The light source module of claim 1, wherein the circuit board a first circuit board surface disposed on the mounting region, and a second circuit board surface, opposite to the first circuit board surface, on which the connector is provided.

8. The light source module of claim 1, further comprising a coupling member,
wherein the coupling member comprises at least one of a screw or a rivet,
wherein a coupling groove is provided in the mounting region of the heat sink, and
wherein the coupling member is inserted through the bracket and into the coupling groove to couple the bracket to the heat sink.

9. The light source module of claim 1, further comprising a coupling member coupling the bracket to the mounting region of the heat sink,
wherein the coupling member is an adhesive.

10. The light source module of claim 1, wherein the lead frame comprises a first end and a second end, opposite to the first end,
wherein the first end of the lead frame has a first convex portion protruding toward the mounting region,
wherein the second end of the lead frame has a second convex portion protruding toward the mounting region,
wherein the connection pad has a first concave portion within which the first convex portion of the first end is disposed, and
wherein the terminal has a second concave portion within which the second convex portion of the second end is disposed.

11. The light source module of claim 1, wherein the light emitting device package comprises a ceramic substrate and at least one light emitting device disposed on the ceramic substrate.

12. The light source module of claim 1, wherein the lead frame comprises a first lead frame and a second lead frame,
wherein the connection pad comprises a first connection pad coupled to the first lead frame, and a second connection pad coupled to the second lead frame,
wherein the terminal comprises a first terminal coupled to the first lead frame, and a second terminal coupled to the second lead frame, and
wherein a first interval between the first connection pad and the second connection pad and a second interval between the first terminal and the second terminal are substantially equal to each other.

13. The light source module of claim 12, wherein the first lead frame and the second lead frame are parallel to each other.

14. A light source module comprising:
a heat sink having a mounting region;
a light emitting device package having a first surface disposed on the mounting region of the heat sink and a second surface opposite to the first surface, the light emitting device package comprising a first connection pad and a second connection pad that are disposed on the second surface;
a circuit board disposed on the mounting region of the heat sink and spaced apart from the light emitting device package, the circuit board comprising:
a connector;
a first terminal electrically connected to the connector; and
a second terminal electrically connected to the connector; and
a bracket disposed between the light emitting device package and the circuit board on the mounting region of the heat sink, and coupled to the heat sink, the bracket comprising:
a first lead frame pressing the first connection pad and the first terminal to connect the first connection pad and the first terminal; and
a second lead frame pressing the second connection pad and the second terminal to connect the second connection pad and the second terminal.

15. The light source module of claim 14, further comprising a coupling member,
wherein the bracket further comprises a body molded to the first lead frame and the second lead frame,
wherein each of the first lead frame and the second lead frame comprises a first end and a second end, opposite to the first end, that protrude out of the body, and
wherein the body is coupled to the heat sink by the coupling member.

16. The light source module of claim 15, wherein the first lead frame and the second lead frame are insert-molded into the body.

17. The light source module of claim 15, wherein each of the first lead frame and the second lead frame further comprises elastic portions bent in a direction toward the first surface of the light emitting device package, to provide elastic force so that the first ends of the first lead frame and the second lead frame press the first connection pad and the second connection pad and the second ends of the first lead frame and the second lead frame press the first terminal and the second terminal.

18. The light source module of claim 17, wherein the elastic portions are spaced apart from the first ends and the second ends of the first lead frame and the second lead frame by a predetermined distance.

19. The light source module of claim 18, wherein each of the first ends and the second ends of the first lead frame and the second lead frame have a respective convex portion protruding toward the mounting region, and wherein each of the first connection pad, the second connection pad, the first terminal and the second terminal has a concave portion within which the respective convex portion of the first ends and the second ends of the first lead frame and the second lead frame is disposed.

20. A light source module comprising:
a heat sink;
a light emitting device package coupled to the heat sink, the light emitting device package comprising a first connection pad and a second connection pad that are provided on a first surface of the light emitting device package and through which power is applied to the light emitting device package;
a circuit board disposed on the heat sink and spaced apart from the light emitting device package, the circuit board comprising a connector, a first terminal and a second terminal, wherein the first terminal and the second terminal are provided on an upper surface of the circuit board and electrically connected to the connector; and
a bracket coupled to the heat sink, the bracket comprising:
   a body disposed between the light emitting device package and the circuit board;
   a first lead frame; and
   a second lead frame, each of the first lead frame and the second lead frame having both ends exposed outside of the body,
wherein the first lead frame presses the first connection pad and the first terminal to connect the first connection pad and the first terminal, and the second lead frame presses the second connection pad and the second terminal to connect the second connection pad and the second terminal.

\* \* \* \* \*